US012622116B2

(12) United States Patent
    Ogawa

(10) Patent No.: US 12,622,116 B2
(45) Date of Patent: May 5, 2026

(54) DEVICE AND A METHOD FOR MANUFACTURING THE SAME

(71) Applicant: HUAWEI TECHNOLOGIES CO., LTD., Shenzhen (CN)

(72) Inventor: Tsuyoshi Ogawa, Osaka (JP)

(73) Assignee: Huawei Technologies Co., LTD., Shenzhen (CN)

( * ) Notice: Subject to any disclaimer, the term of this patent is extended or adjusted under 35 U.S.C. 154(b) by 646 days.

(21) Appl. No.: 18/146,853

(22) Filed: Dec. 27, 2022

(65) Prior Publication Data

US 2023/0131224 A1    Apr. 27, 2023

Related U.S. Application Data

(63) Continuation of application No. PCT/CN2020/098457, filed on Jun. 28, 2020.

(51) Int. Cl.
    *H10H 20/857* (2025.01)
    *H10H 20/833* (2025.01)
    *H10H 20/84* (2025.01)
    *H10H 20/01* (2025.01)

(52) U.S. Cl.
    CPC ........ *H10H 20/857* (2025.01); *H10H 20/833* (2025.01); *H10H 20/84* (2025.01); *H10H 20/0364* (2025.01)

(58) Field of Classification Search
    None
    See application file for complete search history.

(56) References Cited

U.S. PATENT DOCUMENTS

| | | | | |
|---|---|---|---|---|
| 2007/0024800 | A1* | 2/2007 | Ohmi | H05K 3/107 |
| | | | | 349/158 |
| 2016/0351548 | A1* | 12/2016 | Chen | H01L 25/0753 |
| 2017/0025399 | A1* | 1/2017 | Takeya | H05B 33/14 |
| 2017/0309604 | A1 | 10/2017 | Kim | |
| 2017/0336690 | A1 | 11/2017 | Lee et al. | |
| 2018/0277589 | A1 | 9/2018 | Chang | |
| 2020/0343230 | A1* | 10/2020 | Sizov | H01L 25/18 |

FOREIGN PATENT DOCUMENTS

| | | |
|---|---|---|
| CN | 106716641 A | 5/2017 |
| CN | 109300919 A | 2/2019 |
| CN | 109949709 A | 6/2019 |
| CN | 110783361 A | 2/2020 |
| JP | 2020088392 A | 6/2020 |
| KR | 20200011964 A | 2/2020 |

OTHER PUBLICATIONS

Office Action in Japanese Appln. No. 2022-581005, mailed on Jan. 9, 2024, 10 pages (with English translation).
Extended European Search Report in European Appln No. 20943554. 4, dated Jul. 12, 2023, 10 pages.

* cited by examiner

*Primary Examiner* — Feifei Yeung Lopez
(74) *Attorney, Agent, or Firm* — Fish & Richardson P.C.

(57) ABSTRACT

The present disclosure provides devices and method of manufacturing the devices. An example device includes a substrate, a first electrode on the substrate, a light-emitting element electrically connected to the first electrode by a first metal wiring, and a second electrode electrically connected to the light-emitting element. The first electrode and the second electrode are laterally separated from each other. The light-emitting element is connected to the first metal wiring at a side that faces the substrate.

17 Claims, 14 Drawing Sheets

A-A' cross-section

DEVICE AND A METHOD FOR MANUFACTURING THE SAME

CROSS-REFERENCE TO RELATED APPLICATIONS

This application is a continuation of International Application No. PCT/CN2020/098457, filed on Jun. 28, 2020, the disclosure of which is hereby incorporated by reference in its entirety.

TECHNICAL FIELD

The present disclosure relates to a device and a method for manufacture the same. In particular, the present disclosure relates to a display and a method for manufacturing the same using micro-LED.

BACKGROUND ART

In various applications such as mobile phones, automatic display, AR, VR, monitor, TV, and large screen display, etc., high resolution, high brightness, wide viewing angle, and low power consumption, etc. are required, and the need for a display using micrometer-size LED (micro-LED) is increasing.

SUMMARY OF INVENTION

Technical Problem

However, one of the problems with a display, which uses a micro-LED, is a high assembly cost. Conventionally, since the LED has been connected one by one by using bonding processes such as a wire bonding and a flip-chip bonding, the manufacturing cost is high. Therefore, as the number of pixels increases, the manufacturing cost increases. For example, in the case of a 4K display, about 25,000,000 micro-LED are used. Even if the yield of the micro-LED is 99.99%, it is necessary to repair about 2500 micro-LED.

A gang-bonding method as shown in FIG. 1 is present as a method to reduce assembly costs. The gang-bonding method allows a plurality of micro-LED 3 to be bonded to a substrate 1 through the solder 2 at a time, by applying pressure to the plurality of micro-LED 3 by a bonding head 4. However, since the thicknesses of the plurality of micro-LED 3 may vary, the thickness variation absorption film 5 is required for canceling the difference of thicknesses. Even if the thickness variation absorption film 5 is used, the variation in the thickness of the plurality of micro-LED 3 may not be completely cancelled. As a result, different stresses can be applied on the plurality of micro-LED 3. In particular, since the red-light emitting micro-LED 3 can be fabricated from a fragile GaAs, it is easily destroyed by an excessive stress. Therefore, the production of devices using the gang-bonding method has a low yield.

Also, the larger the device's area, the greater the variation of the stresses applied to the device. Moreover, the gang-bonding method has a small area that can be accurately bonded at one time, due to the limited size of the bonding head 4. Therefore, it is difficult to manufacture large screen displays by the gang-bonding method.

In addition, manufacturers need to verify that the micro-LED in the device is operating normally during or after the manufacturing process. However, it is difficult to repair the micro-LED embedded in the device.

Therefore, there is a need for a display and a manufacturing method that have inexpensive manufacturing cost and high yields.

Solution to Problem

The first aspect of the present disclosure is a device comprising:
- a substrate;
- a first electrode on the substrate;
- a light-emitting element electrically connected to the first electrode by a first metal wiring; and
- a second electrode electrically connected to the light-emitting element,
- wherein the first electrode and the light-emitting element are laterally separated from each other, and
- wherein the light-emitting element is connected to the first metal wiring at the side which faces the substrate.

In the above aspect of the present disclosure, the device may further comprise a first aspect including the light-emitting element, wherein a thickness of the first dielectric layer may be greater than or equal to a thickness of the light-emitting element.

In the above aspect of the present disclosure, the first electrode may comprise a pad on the substrate, a first contact metal electrically connected to the pad, and wherein the first metal wiring may be electrically connected to the first contact metal.

In the above aspect of the present disclosure, the device may further comprise an adhesive layer on the substrate, wherein a thickness of the pad may be less than or equal to a thickness of the adhesive layer.

In the above aspect of the present disclosure, the device may further comprise a second dielectric layer on the first electrode, wherein at least one of the first dielectric layer and the dielectric layer may be made of a photosensitive transparent resin.

In the above aspect of the present disclosure, the device may comprise a plurality of the light-emitting elements having different thicknesses.

In the above aspect of the present disclosure, the light-emitting element may be a vertical type micro-LED.

In the above aspect of the present disclosure, the device may further comprise:
- a third electrode on the substrate;
- a repair light-emitting element electrically coupled to the third electrode; and
- a fourth electrode electrically connected to the repair light-emitting element,
- wherein the repair light-emitting element may cover at least a portion of the third electrode.

In the above aspect of the present disclosure, the second electrode and the fourth electrode may be common electrodes.

In the above aspect of the present disclosure, the second electrode and the fourth electrode may be transparent electrodes.

A second aspect of the present disclosure is a method of manufacturing a device, comprising:
- a step of arranging a light-emitting element on a carrier;
- a step of forming a first dielectric layer on the carrier so that the light-emitting element is exposed;
- a step of forming a metal wiring on the light-emitting element and the first dielectric layer;
- a step of forming an adhesive layer on a substrate having a pad;
- a step of bonding the carrier and the substrate,

wherein the metal wiring on the carrier faces the pad
and the adhesive layer on the substrate, and wherein the light-emitting element and the pad are
laterally separated from each other;

a step of removing the carrier;

a step of etching the first dielectric layer and the adhesive
layer until reaching the pad to form an opening;

a step of depositing a contact metal on the opening so that
the pad and the metal wiring are electrically connected
each other;

a step of forming a second dielectric layer on at least the
first dielectric layer so that the light-emitting element is
exposed; and a step of forming an electrode on the light-emitting
element.

In the above aspect of the present disclosure, the light-
emitting element may be a vertical type micro-LED.

In the above aspect of the present disclosure, a thickness
of the first dielectric layer may be greater than or equal to a
thickness of the light-emitting element.

In the above aspect of the present disclosure, the light-
emitting element may comprise a plurality of light-emitting
elements having different thicknesses.

In the above aspect of the present disclosure, a thickness
of the pad may be less than or equal to a thickness of the
adhesive layer.

In the above aspect of the present disclosure, the step of
arranging a light-emitting element on the carrier may com-
prise a step of transferring the light-emitting element pro-
vided on a spare substrate to a spare carrier, and a step of
transferring the light-emitting element transferred to the
spare carrier, to the carrier.

In the above aspect of the present disclosure, the electrode
may be a common electrode.

In the above aspect of the present disclosure, the electrode
may be a transparent electrode.

In the above aspect of the present disclosure, at least one
of the first dielectric layer and the dielectric layer may be
made of a photosensitive transparent resin.

In the above aspect of the present disclosure, the method
may comprise:

prior to the step of forming the second dielectric layer, a
step of testing an operation of the light-emitting ele-
ment;

when the light-emitting element does not operate, a step
of cutting the metal wiring connected to the non-
operating light-emitting element; and a step of arranging a repair light-emitting element on a
contact metal connected to the cut metal wiring.

In the above aspect of the present disclosure, the step of
testing an operation of the light-emitting element may
comprise a step of electrically connecting a test carrier
having a conductive layer to the light-emitting element.

In the above aspect of the present disclosure, the step of
arranging a repair light-emitting element on the contact
metal may comprise a step of bonding using solder.

In the above aspect of the present disclosure, the step of
forming a second dielectric layer on at least the first dielec-
tric layer may comprise a step of forming the second
dielectric layer on the opening so that the repair light-
emitting element is exposed, and the steep of forming an electrode on the light-emitting element comprises a step of
forming the electrode on the repair light-emitting element.

Advantageous Effects of Invention

Since the present disclosure uses the wiring process which
is a mature technology, it can provide a display and a
manufacturing method that have inexpensive manufacturing
cost and high yields.

BRIEF DESCRIPTION OF DRAWINGS

FIG. 4 shows a step of transferring the light-emitting
element, which is transferred to a spare carrier, to a carrier.

FIG. 7 shows the step of removing the carrier.

FIG. 12 shows a step of arranging a repair light-emitting
element on the contact metal connected to the cut metal
wiring.

FIG. 13 shows a step of forming a second dielectric layer
on at least the first dielectric layer so that the light-emitting
element is exposed.

FIG. 14 shows a step of forming an electrode on the
light-emitting element.

DESCRIPTION OF EMBODIMENTS

Hereinafter, the embodiment of the present disclosure will
be described in detail with reference to the accompanying
drawings. Although the following detailed description
describes the display where the micro-LED is used, the
present disclosure is applicable to an edge-emitting laser, an
optical communication device using a VCSEL (vertical-
resonant surface-emitting laser), a ToF module (image sen-
sor), a laser printer, and the like.

Figure 1:
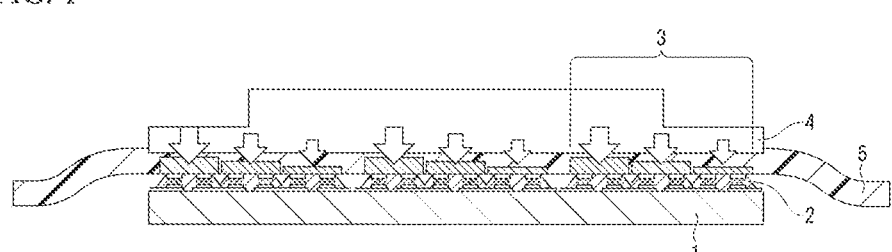
FIG. 1 shows the gang-bonding method, which is a
conventional technique.
Figure 2:
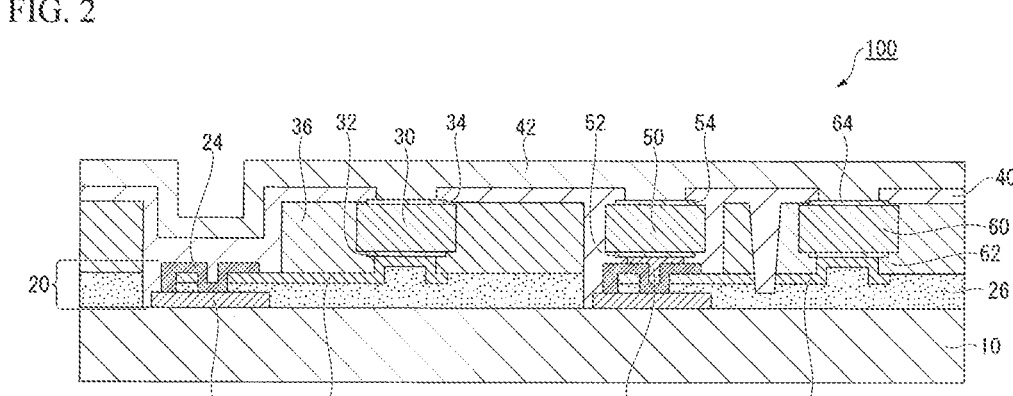
FIG. 2 shows a device according to the present disclosure.

FIG. 2 shows a device 100 according to the present
disclosure.

The device 100 of the present disclosure may include a
substrate 10; a first electrode 20 which includes a pad 22 on
the substrate 10, and a contact metal 24 electrically con-
nected to the pad 22; an adhesive layer 26; a first dielectric
layer 36; a light-emitting element 30 which has an upper
electrode 34 at the opposite side of the substrate 10 and a
lower electrode 32 at the side which faces the substrate 10;
a metal wiring 28 one end of which is electrically connected
to the contact metal 24 and the other end of which is
electrically connected to the lower electrode 32 of the light-emitting element 30; a second dielectric layer 40; and a second electrode 42 electrically connected to the upper electrode 34 of the light-emitting element 30. The metal wiring 28 electrically connects the first electrode 20 and the light-emitting element 30. The metal wiring 28 extends laterally from the contact metal 24 toward the light-emitting element 30. Also, the first electrode 20 and the light-emitting element 30 are laterally separated from each other. Herein, the term of "laterally" refers to a direction parallel to the surface of the substrate 10. For example, a plurality of components being laterally separated means that each component does not overlap in the top view. A plurality of components being laterally separated does not limit that each component is present in the same plane.

The device 100 of the present disclosure is manufactured by the mature wiring method without using a bonding method that applies a high pressure. Therefore, the yield of the manufactured device is improved compared to the process using the bonding which is highly likely to break the light-emitting element 30, and the manufacture of the large-size device is facilitated.

In addition, the device 100 of the present disclosure may further comprise a repair light-emitting element 50. The repair light-emitting element 50 is electrically connected to the contact metal 24 via the lower electrode 52 and the solder 56, and may be electrically connected to the second electrode 42 via the upper electrode 54 thereof.

Furthermore, the device 100 of the present disclosure may include a NG emitting element 60 that does not operate normally. The NG light-emitting element 60 may be electrically connected to a cut metal wiring 58 at lower electrode 62 thereof, and may be electrically connected to the second electrode 42 at the upper electrode 64 thereof. Because the metal wiring is cut, no voltage is applied for the NG light-emitting element 60 between the first electrode 20 and the second electrode 42.

The method of manufacturing the device 100 of the present disclosure will be described.

Figure 3:
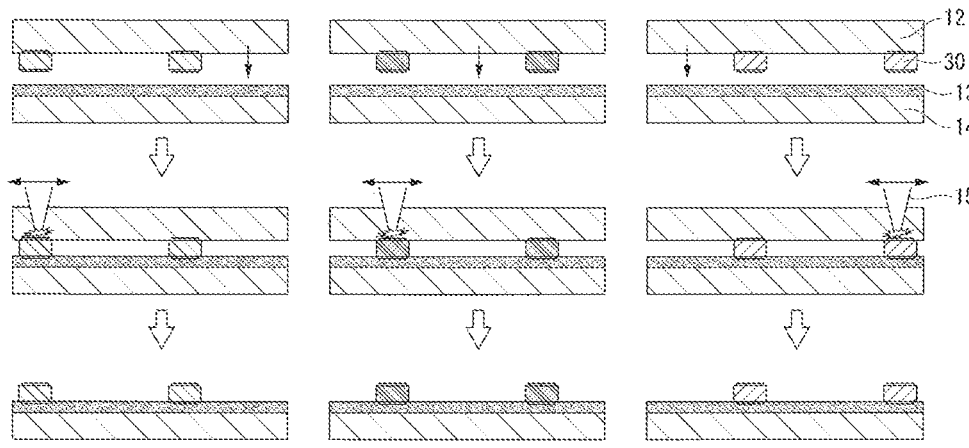
FIG. 3 shows a step of transferring a light-emitting
element provided on a spare substrate to a spare carrier.

FIG. 3 shows a step of transferring the light-emitting element 30 provided on the spare substrate 12 to the spare carrier 14. The spare carrier 14 may have a first adhesive 13. The spare substrate 12 is brought close to the spare carrier 14, so that the light-emitting element 30 on the spare substrate 12 comes into contact with the first adhesive 13 on the spare carrier 14. Thereafter, the light-emitting element 30 is removed from the spare substrate 12, for example with a laser lift off (LLO) using a laser 15, and is transferred on the spare carrier 14.

The spare substrate 12 may be a substrate commonly used in the art. For example, the spare substrate 12 may be a sapphire substrate, a gallium nitride substrate, or the like.

The light-emitting element 30 may be a plurality of light-emitting elements, for example a red light-emitting element, a green light-emitting element, and a blue light-emitting element. The plurality of light-emitting elements may have different thicknesses. Since the device 100 of the present disclosure may comprise light-emitting elements having different thicknesses, a multi-color display can be provided.

The light-emitting element 30 may be a light-emitting diode (LED). The LED may be a micro-LED. The micro-LED refers to an LED having a footprint of less than about 50 μm×50 μm, preferably less than 20 μm×20 μm or less, and more preferably less than about 10 μm×10 μm. The micro-LED can be a vertical type micro-LED. The vertical type micro-LED refers to an LED having the upper electrode 34 and the lower electrode 32. Since the vertical type micro-LED with the electrodes in the vertical direction can be smaller in footprint, the higher pixel per inches (PPI) can be achieved.

At least one electrode of the vertical type micro-LED face the substrate 10. Therefore, in the conventional technology, the electrode which faces the substrate is electrically connected to the pad on the substrate, by bonding method using solder or the like. In the bonding method, it is difficult to connect the micro-LED and the substrate accurately at a time. In contrast, the metal wiring 28 which uses the wiring method can electrically connect to the micro-LED30 and the pad 22 in the present disclosure.

The first adhesive 13 may be an adhesive commonly used in the art. For example, the first adhesive 13 may be a thermoset adhesive such as epoxy, acrylic, or silicone-based adhesive, or a UV-curable adhesive.

The pad 22 may be a pad commonly used in the art. For example, the pad 22 may be titanium, nickel, chromium, gold, copper, or an alloy thereof.

The laser 15 may be a laser commonly used in the art. For example, the laser 15 may be a UV laser emitting a wavelength of 200-400 nm, a green-emitting laser, or a near-infrared laser emitting a wavelength of 800-1,000 nm.

Figure 4:
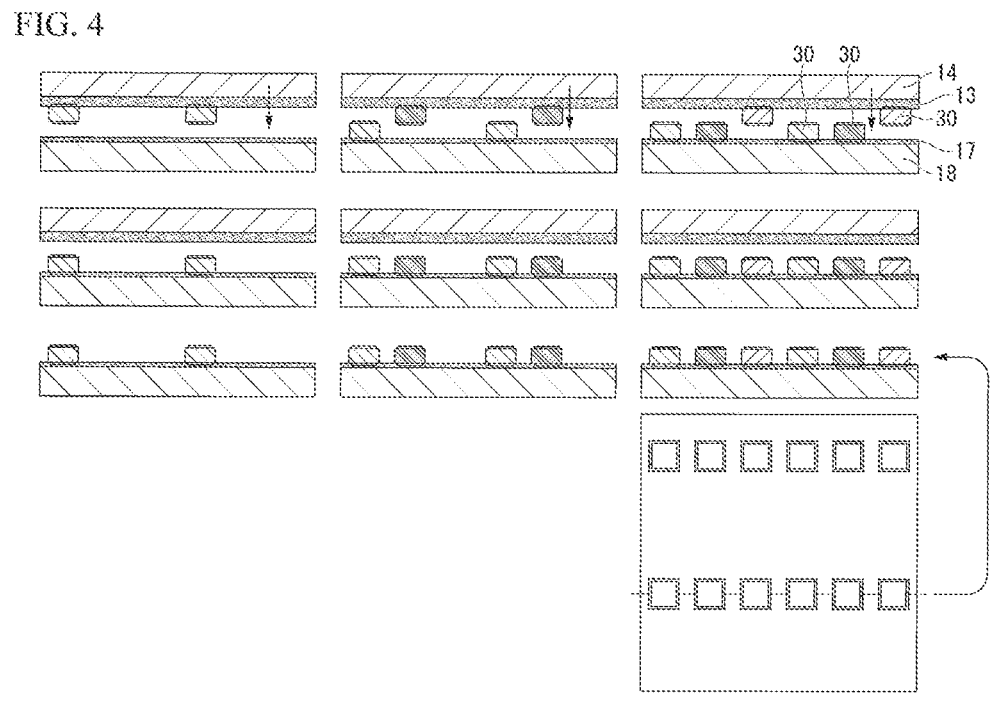

FIG. 4 shows a step of transferring the light-emitting element 30 which is transferred to the spare carrier 14, to the carrier 18. The carrier 18 may have a second adhesive 17. The spare carrier 14 is brought close to the carrier 18 so that the light-emitting element 30 on the spare carrier 14 comes into contact with the second adhesive 17 on the carrier 18. Then, the light-emitting element 30 is removed from the spare carrier 14, for example by utilizing the difference of adhesion force between the first adhesive 13 on the spare carrier 14 and the second adhesive 17 on the carrier 18, and the light-emitting element 30 is transferred on the carrier 18. In this case, the adhesion force of the second adhesive 17 on the carrier 18 is greater than the adhesion force of the first adhesive 13 on the spare carrier 14.

As shown in the top view in the lower-right of FIG. 4, the plurality of light-emitting elements 30 may be accurately placed on a predetermined location on the carrier 18.

The carrier 18 may be a carrier commonly used in the field. For example, the carrier 18 may be a carrier made of quartz or glass. The spare carrier 14 and the carrier 18 may be made of the same material or different materials.

The second adhesive 17 may be an adhesive commonly used in the art. For example, the second adhesive 17 may be a thermoset adhesive such as epoxy, acrylic, or silicone-based adhesive, or a UV-curable adhesive. The first adhesive 13 and the second adhesive 17 may be made of the same material or different materials.

In FIGS. 5 to 14 below, the top view and the cross-sectional views along A-A', B-B', and C-C' in the top view of the embodiment of the present disclosure are shown.

Figure 5:
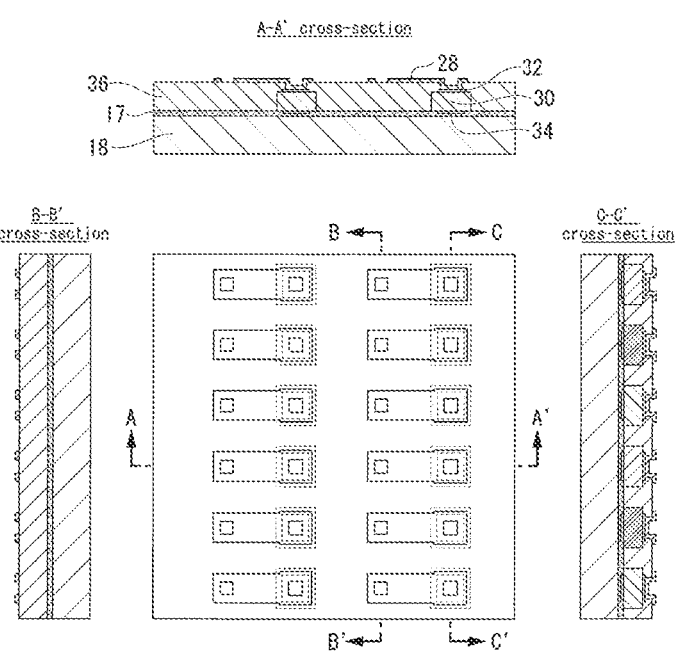
FIG. 5 shows a step of forming a first dielectric layer on
the carrier so that the light-emitting element is exposed, and
forming a metal wiring on the light-emitting element and on
the first dielectric layer.

FIG. 5 shows a step of forming a first dielectric layer 36 on the carrier 18 so that the light-emitting element 30 is exposed, and forming a metal wiring 28 on the light-emitting element 30 and the first dielectric layer 36. As shown in the A-A' section, the first dielectric layer 36 is formed on the carrier 18. The first dielectric layer 36 includes a light-emitting element 30. The first dielectric layer 36 has a via in which the electrode 32 of the light-emitting element 30 is exposed. Thereafter, the metal wiring 28 is formed on the first dielectric layer 36 and in the via, and one end of the metal wiring 28 is electrically connected to the light-emitting element 30.

The metal wiring 28 is formed, for example by lithography using a photoresist. A metal layer is deposited on the first dielectric layer 36 and in the via, and the photoresist is patterned on the metal layer. Thereafter, the metal layer is patterned by etching along the photoresist pattern. Thereafter, the photoresist is removed to form the metal wiring 28.

The first dielectric layer 36 may include a photosensitive material, or a non-photosensitive material such as thermoset material. Preferably, the first dielectric layer 36 may include a photosensitive material. More preferably, the first dielectric layer 36 may include a photosensitive resin. If the first dielectric layer 36 includes a photosensitive resin, the formation of the via by lithography is easy. Also, the flexibility of the device can be increased, enabling the production of large size devices.

The metal wiring 28 may be any conductive material including metal, and may be any conductive metal or conductive metal oxide. Preferably, the metal wiring 28 may be one or more selected from the group consisting of copper, nickel, titanium, chromium, and indium tin oxide (ITO).

The thickness of the first dielectric layer 36 may be greater than or equal to the thickness of the light-emitting element 30. Since a portion of the light-emitting element 30 is covered by the first dielectric layer 36, the mechanical strength of the device is increased. Therefore, the yield of the device can be improved, and enabling the manufacture of the large-size device.

Thereafter, a substrate 10 having a pad 22 is provided, and the adhesive layer 26 is formed on the substrate 10.

Figure 6:
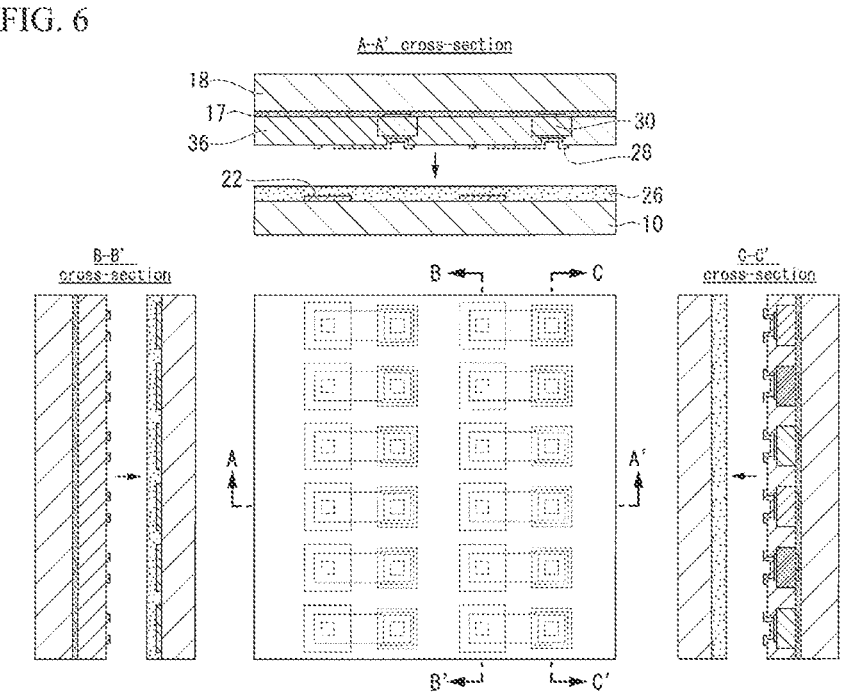
FIG. 6 shows a step of bonding the carrier to the substrate.

FIG. 6 shows a step of bonding the carrier 18 and the substrate 10. The metal wiring 28 on the carrier 18 may face the pad 22 and adhesive layer 26 on the substrate 10. The metal wiring 28 can be accurately aligned with the pad 22. The carrier 18 is brought close to the substrate 10, the carrier 18 and the substrate 10 are bonded by the adhesive layer 26 so that the light-emitting element 30 and the pad 22 are laterally separated from each other. The pad 22 and the light-emitting element 30 are separated laterally and electrically connected by the metal wiring 28.

The substrate 10 may be a substrate commonly used in the art. For example, the substrate 10 is, for example, a driving substrate in which a TFT is formed on a glass substrate.

The adhesive layer 26 may be a thermoset adhesive such as epoxy, acrylic, or silicone-based adhesive, or a UV-curable adhesive. Thus, the flexibility of the device can be increased, enabling the production of large size devices.

The thickness of pad 22 may be less than or equal to the thickness of adhesive layer 26. Thus, since the metal wiring 28 does not come into contact with the pad 22 in the step of bonding the carrier 18 and the substrate 10, the undesired stress does not occur. Therefore, the yield of the device can be improved, and enabling the manufacture of the large-size device.

Figure 7:
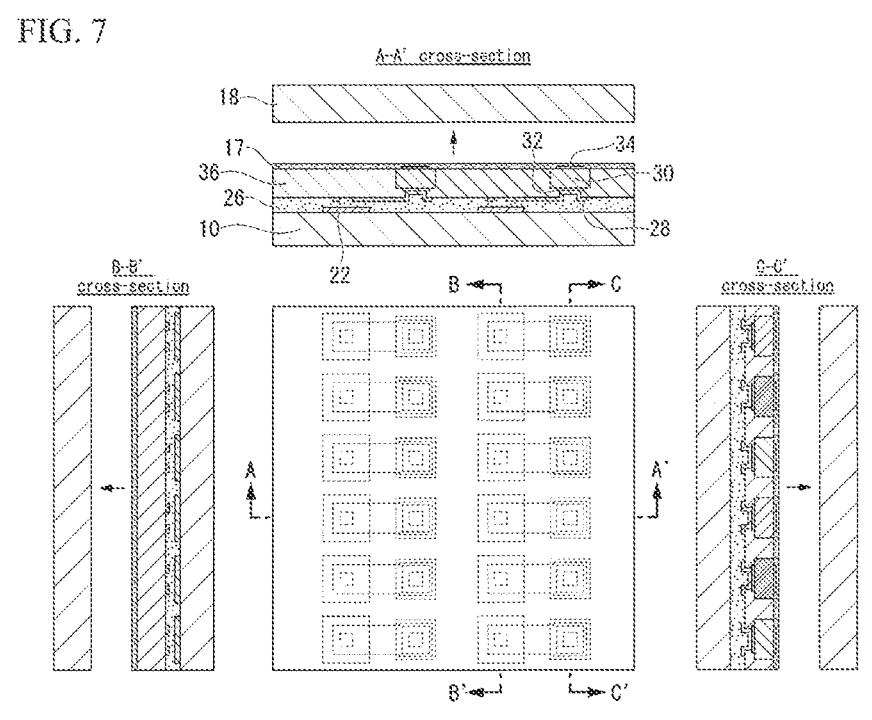

FIG. 7 shows a step of removing the carrier 18. The removal of the carrier 18 may be performed using known techniques in the art such as laser lift-off (LLO), mechanical removal, and the like. For example, a UV laser passing through the carrier 18 is irradiated to the second adhesive 17, and the carrier 18 is peeled from the second adhesive 17. Although not shown, the second adhesive 17 may be removed and the upper electrode 34 of the light-emitting element 30 may be exposed after the carrier 18 has been removed.

Figure 8:
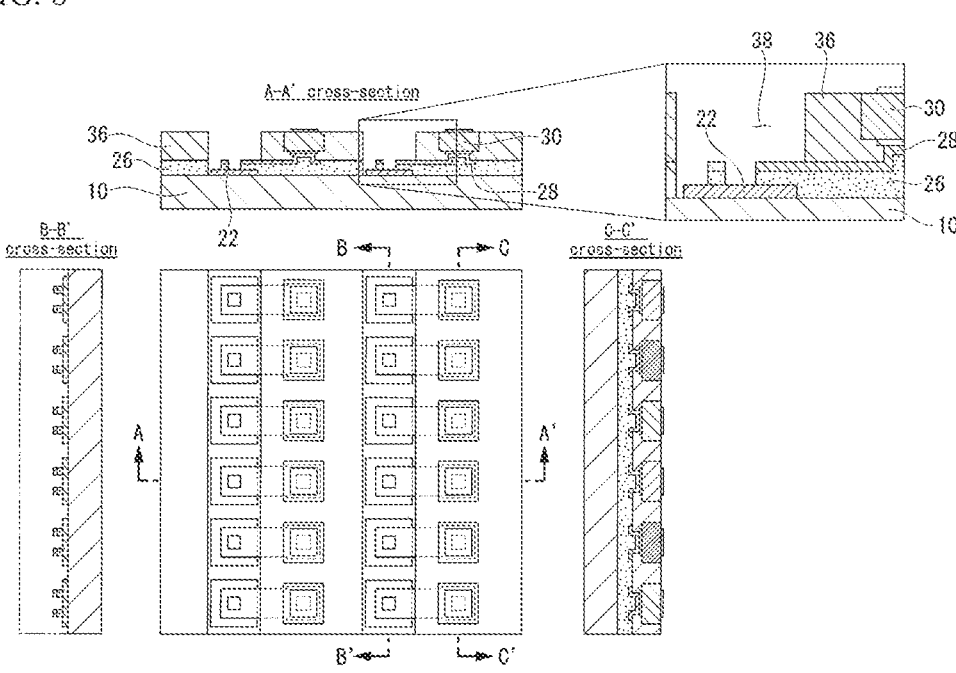
FIG. 8 shows a step of forming an opening by etching the
first dielectric layer and the adhesive layer until reaching a
pad.

FIG. 8 shows a step of forming an opening 38 by etching the first dielectric layer 36 and the adhesive layer 26 until reaching the pad 22. The metal wiring 28 may serve as a mask against etching. After etching, the pad 22 and the metal wiring 28 may be exposed at the opening 38.

At this step, the pad 22 and the metal wiring 28 may not be electrically connected.

Etching may be performed using techniques known in the art. For example, etching may be performed by reactive ion etching, such as oxygen plasma etching.

Figure 9:
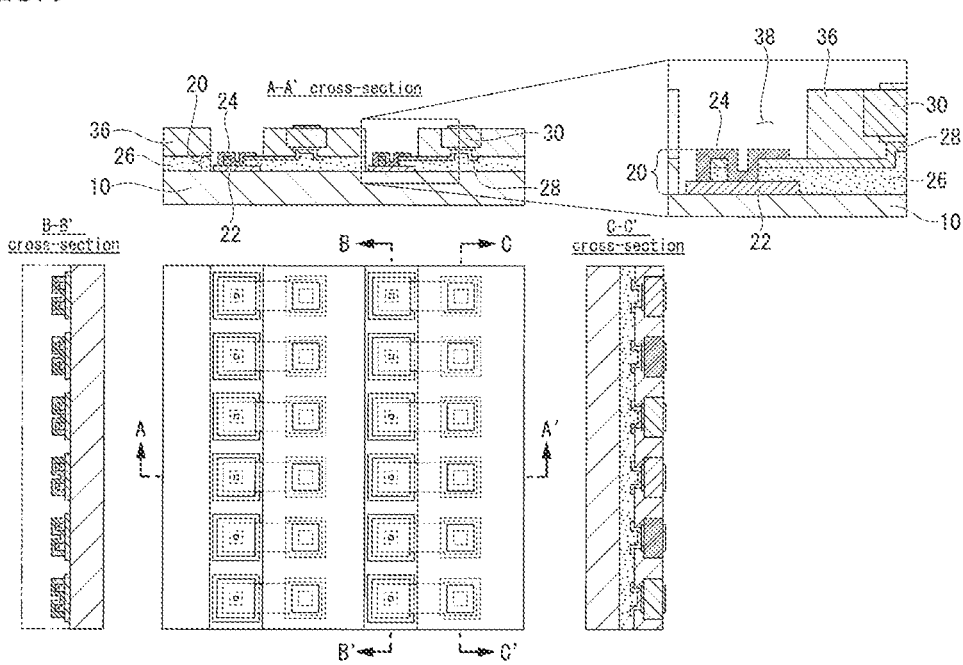
FIG. 9 shows a step of depositing a contact metal in the
opening so that the pad and the metal wiring are electrically
connected.

FIG. 9 shows a step of depositing the contact metal 24 on the opening 38, so that the pad 22 and the metal wiring 28 are electrically connected. The pad 22 and the contact metal 24 may constitute the first electrode 20. Thus, the pad 22 and the light-emitting element 30 may be electrically connected via the contact metal 24 and the metal wiring 28. The deposition of the contact metal 24 may be performed by sputtering, photoresist formation, and etching of metal layers, etc.

Figure 10:
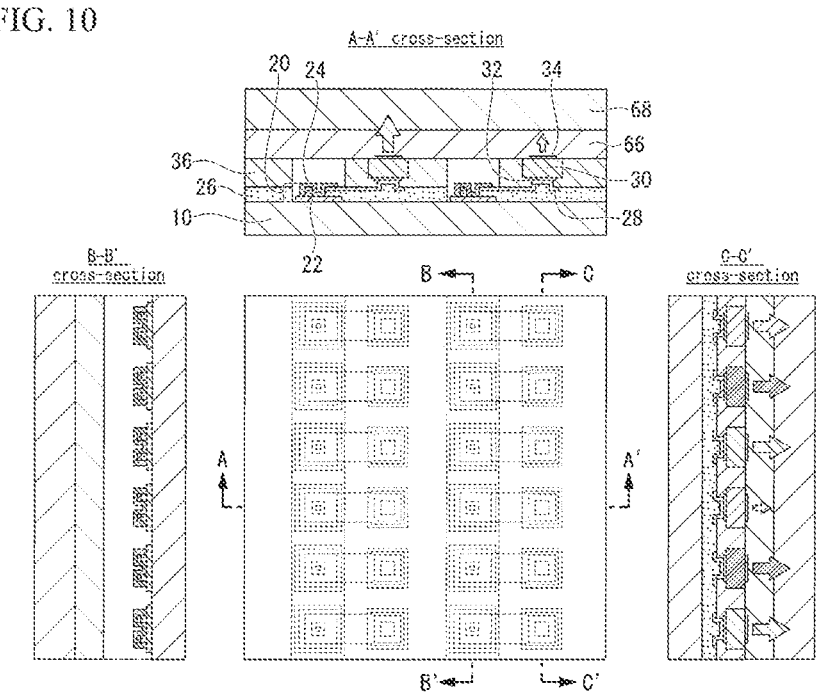
FIG. 10 shows a step of testing the operation of the
light-emitting element.
Figure 11:
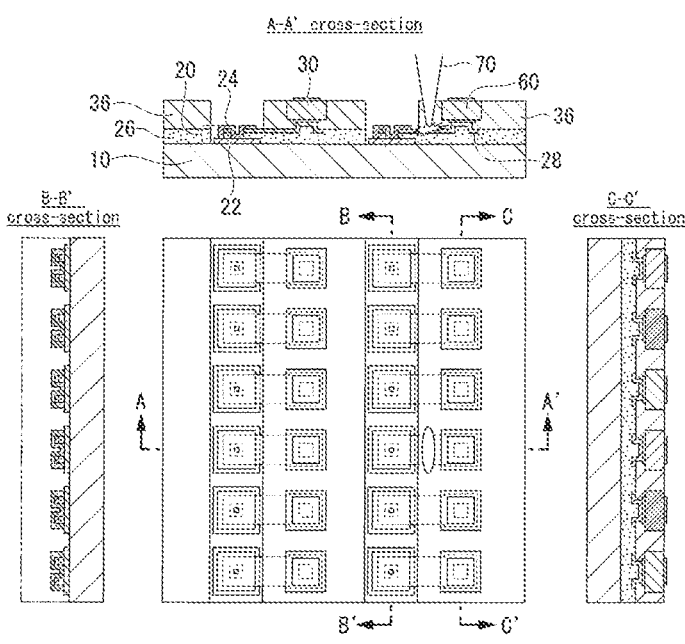
FIG. 11 shows a step of cutting a metal wiring connected
to a light-emitting element that does not operate if the
light-emitting element does not operate.
Figure 12:
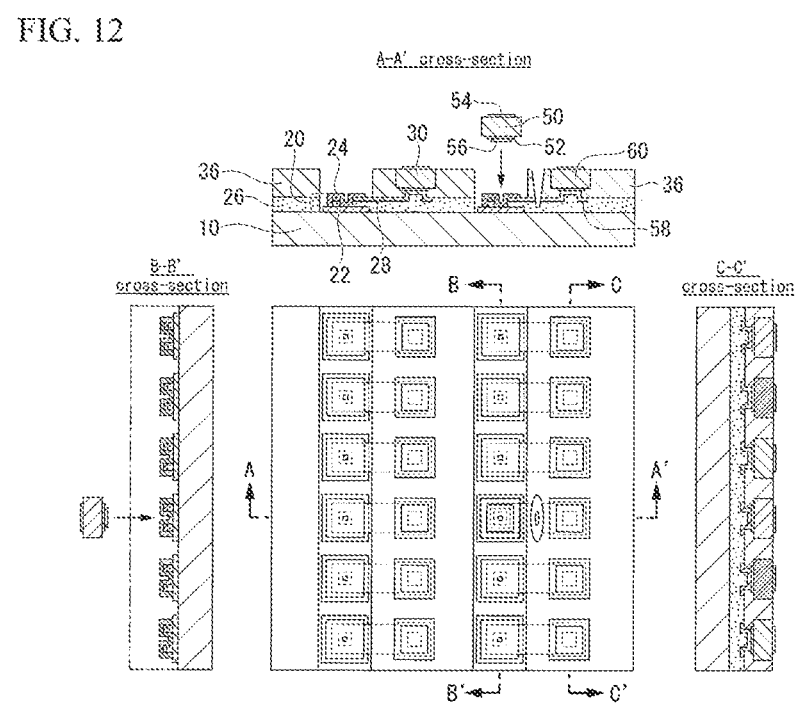

FIGS. 10 to 12 show from a step of testing the operation of the light-emitting element 30 to a step of arranging a repair light-emitting element 50. These steps are any steps. These steps may be performed prior to a step of forming the second dielectric layer 40.

FIG. 10 shows a step of testing the operation of the light-emitting element 30. This step may include a step of electrically connecting a test carrier 68 having a conductive layer 66 to the light-emitting element 30. The test carrier may be made of glass. The conductive layer 66 may be a conductive sheet having a low modulus of elasticity. Since the conductive layer 66 has a low modulus of elasticity, the conductive layer 66 and the upper electrode 34 of the light-emitting element 30 may be electrically connected by applying an appropriate pressure.

Thereafter, it is possible to test whether the light-emitting element 30 operates normally by applying a voltage between the pad 22 and the conductive layer 66 to induce the electroluminescence (EL) of the light-emitting element 30. Instead of the EL, it is possible to test the operation of the light-emitting element 30 by using photoluminescence (PL). When the PL is used, it is possible to test whether the light-emitting element 30 operates normally by inducing PL in the light-emitting layer of the light-emitting element 30 by an excitation light such as ultraviolet light.

FIG. 11 shows a step of cutting the metal wiring 28 connected to the light-emitting element 60 which does not operate normally. If the light-emitting element 30 does not operate normally, for example, it does not emit light or the light emission intensity is less than a predetermined value, such light-emitting element 30 is referred to as the NG light-emitting element 60. The metal wiring 28 connected to the NG light-emitting element 60 is cut, for example, by the laser 70, and the NG light-emitting element 60 and the pad 22 loses electrical connection therebetween.

The laser 70 may be a laser commonly used in the art. For example, the laser 70 may be a UV laser emitting a wavelength of 200-400 nm, a green-emitting laser, a near-infrared laser emitting a wavelength of 800-1,000 nm, or a $CO_2$ laser emitting a wavelength near 10 microns.

FIG. 12 shows a step of arranging a repair light-emitting element 50 on the contact metal 24 connected to the cut metal wiring 58. This step may comprise a step of bonding the lower electrode 52 of the repair light-emitting element 50 and the contact metal 24 using solder 56. The repair light-emitting element 50 may be electrically connected to the first electrode 20 on the substrate 10. The solder 56 may be formed on the lower electrode 52 of the repair light-emitting element 50 or on the contact metal 24. The repair light-emitting element 50 may cover at least a portion of the first electrode 20 including the contact metal 24 and the pad 22.

According to any of the steps shown in FIGS. 10 to 12, the test of the operation of the light-emitting element 30 and the arrangement of the repair light-emitting element 50 are carried out. Thus, in the process of the present disclosure, the test and the repair of the light-emitting element 30 can be easily performed.

Figure 13:
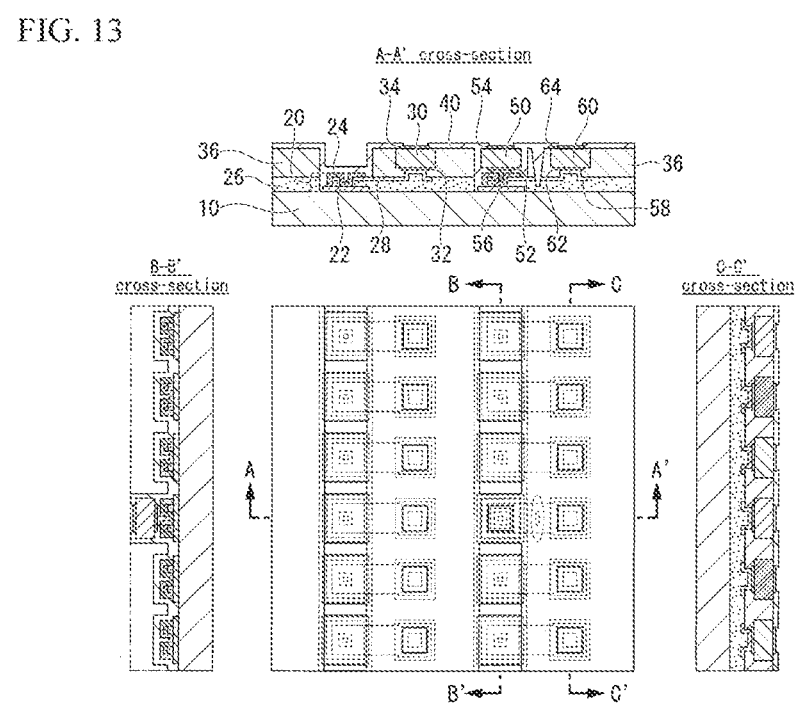

FIG. 13 shows a step of forming a second dielectric layer 40 on at least the first dielectric layer 36, so that the light-emitting element 30 is exposed. Optionally, this step may comprise a step of forming the second dielectric layer 40 on at least the first dielectric layer 36, so that the repair element 50 is exposed.

The second dielectric layer 40 may have a via in which the upper electrode 34 of the light-emitting element 30 is exposed. Optionally, the second dielectric layer 40 may have a via in which the upper electrode 54 of the repair element 50 is exposed.

Also, the second dielectric layer 40 may be formed on at least one of the substrate 10, the pad 22, the contact metal 24, the adhesive layer 26, and the metal wiring 28, at the opening 38. The second dielectric layer 40 may be formed on the first electrode 20.

The second dielectric layer 40 may include a photosensitive material, or a non-photosensitive material such as thermoset material. Preferably, the first dielectric layer 36 may include a photosensitive material. More preferably, the first dielectric layer 36 may include a photosensitive resin. If the second dielectric layer 40 includes a photosensitive resin, the formation of the via by dry etching is easy. Also, the flexibility of the device can be increased, enabling the production of large size devices. The first dielectric layer 36 and the second dielectric layer 40 may be made of the same material or different materials.

Figure 14:
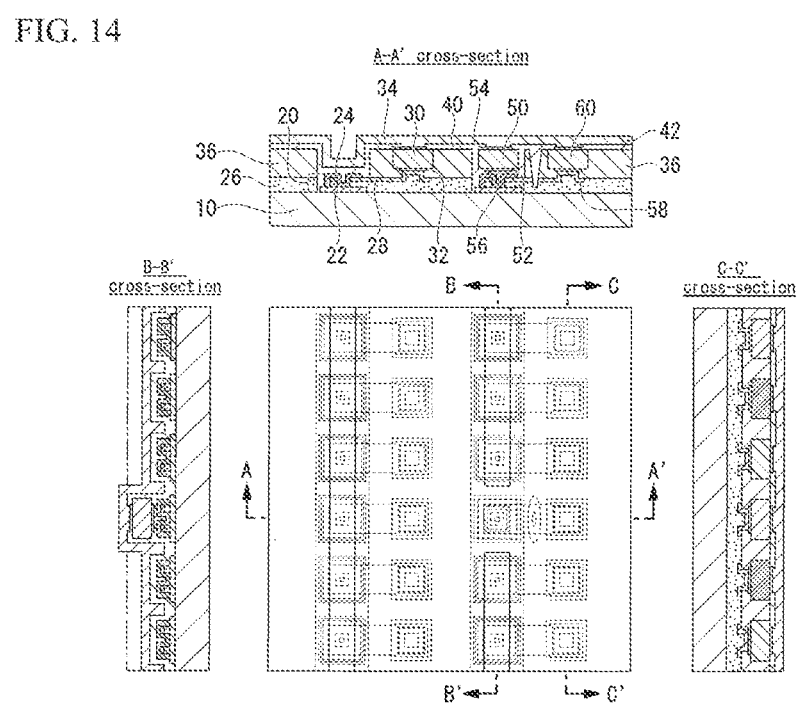

FIG. 14 shows a step of forming a second electrode 42 on the light-emitting element 30. The second electrode 42 may be electrically connected to the upper electrode 34 of the light-emitting element 30. The second electrode 42 may be formed on the second dielectric layer 40. The second electrode 42 may be a common electrode that is electrically connected to the plurality of light emitting devices 30. Also, the second electrode 42 may be a transparent electrode.

Optionally, the step of forming the second electrode 42 on the light-emitting element 30 may comprise a step of forming the second electrode 42 on the repair light-emitting element 50. The second electrode 42 may be electrically connected to the upper electrode 54 of the repair light-emitting element 50. The second electrode 42 may be a common electrode that is electrically connected to the repair light-emitting element 50 and the light-emitting element 30.

As described above, the device 100 of the present disclosure is manufactured. In the manufacturing process of the present disclosure, the metal wiring 28 is formed by the mature wiring method. Although a bonding method is used in the step of arranging the repair light-emitting element 50 on the contact metal 24, no bonding method is used in other processes.

Accordingly, the present disclosure can provide a display using micro-LED and a manufacturing method the same, which have high yield and is applicable to a large screen, and, if necessary, is capable of the repair of the micro-LED.

DESCRIPTION OF SYMBOLS

1. Substrate
2. Solder
3. LED
4. Bonding Head

5. Thickness Variation Absorption Film
10. Substrate
12. Spare Substrate
13. First Adhesive
14. Spare Carrier
15. Laser
17. Second Adhesive
18. Carrier
20. First Electrode
22. Pad
24. Contact Metal
26. Adhesive Layer
28. Metal Wiring
30. Light-emitting Element, micro-LED
32. Lower Electrode
34. Upper Electrode
36. First Dielectric Layer
38. Opening
40. Second Dielectric Layer
42. Second Electrode
50. Repair Light-emitting Element
52. Lower Electrode
54. Upper Electrode
56. Solder
58. Cut Metal Wiring
60. NG Light-emitting Element
62. Lower Electrode
64. Upper Electrode
66. Conductive Layer
68. Test Carrier
70. Laser
100. Device

The invention claimed is:

1. A device comprising:
a substrate;
a first electrode on the substrate, wherein the first electrode comprises a pad on the substrate and a first contact metal electrically connected to the pad;
a light-emitting element electrically connected to the first electrode by a first metal wiring, wherein the first metal wiring is electrically connected to the first contact metal;
a second electrode electrically connected to the light-emitting element,
wherein the first electrode and the light-emitting element are laterally separated from each other, and
wherein the light-emitting element is connected to the first metal wiring at a side that faces the substrate;
a first dielectric layer including the light-emitting element, wherein a thickness of the first dielectric layer is greater than or equal to a thickness of the light-emitting element;
an adhesive layer on the substrate, wherein a thickness of the pad is less than or equal to a thickness of the adhesive layer; and
a second dielectric layer on the first electrode, wherein at least one of the first dielectric layer or the second dielectric layer is made of a photosensitive transparent resin.

2. The device of claim 1, comprising a plurality of light-emitting elements having different thicknesses.

3. The device of claim 1, wherein the light-emitting element is a vertical type micro-light-emitting diode (LED).

4. The device of claim 1, further comprising:
a third electrode on the substrate;
a repair light-emitting element electrically coupled to the third electrode; and a fourth electrode electrically connected to the repair light-emitting element, wherein the repair light-emitting element covers at least a portion of the third electrode.

5. The device of claim 4, wherein the second electrode and the fourth electrode are common electrodes.

6. The device of claim 4, wherein the second electrode and the fourth electrode are transparent electrodes.

7. A method of manufacturing a device, comprising:

arranging a light-emitting element on a carrier;

forming a first dielectric layer on the carrier so that the light-emitting element is exposed;

forming a metal wiring on the light-emitting element and the first dielectric layer;

forming an adhesive layer on a substrate having a pad;

bonding the carrier and the substrate, wherein the metal wiring on the carrier faces the pad and the adhesive layer on the substrate, and wherein the light-emitting element and the pad are laterally separated from each other;

removing the carrier;

etching the first dielectric layer and the adhesive layer until reaching the pad to form an opening;

depositing a contact metal on the opening so that the pad and the metal wiring are electrically connected each other;

forming a second dielectric layer on at least the first dielectric layer so that the light-emitting element is exposed; and forming an electrode on the light-emitting element.

8. The method of claim 7, wherein the light-emitting element is a vertical type micro-light-emitting diode (LED).

9. The method of claim 7, wherein a thickness of the first dielectric layer is greater than or equal to a thickness of the light-emitting element.

10. The method of claim 7, wherein the light-emitting element comprises a plurality of light-emitting elements having different thicknesses.

11. The method of claim 7, wherein a thickness of the pad is less than or equal to a thickness of the adhesive layer.

12. The method of claim 7, wherein arranging the light-emitting element on the carrier comprises:

transferring the light-emitting element provided on a spare substrate to a spare carrier; and transferring the light-emitting element transferred to the spare carrier to the carrier.

13. The method of claim 7, wherein the electrode is a common electrode.

14. The method of claim 7, wherein the electrode is a transparent electrode.

15. The method of claim 7, wherein at least one of the adhesive layer, the first dielectric layer, or the second dielectric layer is made of a photosensitive transparent resin.

16. The method of claim 7, comprising:

prior to forming the second dielectric layer, testing an operation of the light-emitting element;

if the light-emitting element does not operate, cutting the metal wiring connected to the non-operating light-emitting element; and arranging a repair light-emitting element on a contact metal connected to the cut metal wiring.

17. The device of claim 1, wherein the adhesive layer includes a thermoset adhesive or a UV-curable adhesive.

\* \* \* \* \*